United States Patent
Tsuchiya

(10) Patent No.: US 7,894,191 B2
(45) Date of Patent: Feb. 22, 2011

(54) FAN ROTATION CONTROL METHOD, FAN ROTATION CONTROL SYSTEM, AND FAN ROTATION CONTROL PROGRAM

(75) Inventor: Junichiro Tsuchiya, Tokyo (JP)

(73) Assignee: NEC Corporation, Tokyo (JP)

( * ) Notice: Subject to any disclaimer, the term of this patent is extended or adjusted under 35 U.S.C. 154(b) by 167 days.

(21) Appl. No.: 12/048,579

(22) Filed: Mar. 14, 2008

(65) Prior Publication Data
US 2008/0232974 A1    Sep. 25, 2008

(30) Foreign Application Priority Data
Mar. 22, 2007    (JP) .............................. 2007-075127

(51) Int. Cl.
*H05K 7/20* (2006.01)
(52) U.S. Cl. .................. 361/695; 361/679.48; 361/688; 361/690; 361/694; 417/2; 62/259.2; 700/300; 454/184
(58) Field of Classification Search ............ 361/679.31, 361/679.48, 679.54, 695, 708, 688, 690, 361/694
See application file for complete search history.

(56) References Cited

U.S. PATENT DOCUMENTS

| | | | | |
|---|---|---|---|---|
| 5,631,852 A | * | 5/1997 | Chen ........................... | 702/130 |
| 5,687,079 A | * | 11/1997 | Bauer et al. .................... | 700/70 |
| 5,963,887 A | * | 10/1999 | Giorgio ........................ | 702/64 |
| 6,134,667 A | * | 10/2000 | Suzuki et al. ................ | 713/300 |
| 6,396,688 B1 | * | 5/2002 | Davies et al. ........... | 361/679.48 |
| 6,398,505 B1 | * | 6/2002 | Sekiguchi ....................... | 417/2 |
| 6,654,894 B2 | * | 11/2003 | Kaminski et al. ............ | 713/300 |
| 7,484,380 B2 | * | 2/2009 | Flanigan et al. ............. | 62/259.2 |
| 7,571,617 B2 | * | 8/2009 | Inoue et al. .................... | 62/157 |
| 2006/0142901 A1 | * | 6/2006 | Frankel et al. .............. | 700/300 |

FOREIGN PATENT DOCUMENTS

| | | |
|---|---|---|
| JP | 08-075297 | 3/1996 |
| JP | 09-060944 | 3/1997 |
| JP | 11-40971 | 2/1999 |
| JP | 2000-346512 | 12/2000 |

* cited by examiner

*Primary Examiner*—Boris L. Chervinsky
*Assistant Examiner*—Courtney Smith
(74) *Attorney, Agent, or Firm*—Scully, Scott, Murphy & Presser, P.C.

(57) ABSTRACT

The present invention aims to appropriately cool an operation unit and to suppress power consumption and noise according to the configuration and the operation state in a computer system of an enclosure. A plurality of system cooling fans for cooling the operation unit of the computer system installed in the enclosure and an enclosure management module for controlling the rotation of each system cooling fan are arranged, where the enclosure management module stores in advance the supply cooling amount which is to be supplied to the operation unit by each system cooling fan, acquires information related to a temperature of the operation unit and calculates a necessary cooling amount which is to be required in the operation unit based on the information, and determines the rotation number of each system cooling fan based on the supply cooling amount and the necessary cooling amount.

15 Claims, 6 Drawing Sheets

FAN ROTATION CONTROL METHOD, FAN ROTATION CONTROL SYSTEM, AND FAN ROTATION CONTROL PROGRAM

CROSS-REFERENCE TO RELATED APPLICATION

This application is based upon and claims the benefit of priority from Japanese patent application No. 2007-075127, filed on Mar. 22, 2007, the disclosure of which is incorporated herein in its entirety by reference.

BACKGROUND OF THE INVENTION

1. Field of the Invention

The present invention relates to cooling control devices, and in particular, to a cooling control device for controlling the operation of a cooling fan arranged in a computer system.

2. Description of the Related Art

The computer system generates heat with the operation of devices such as CPU and hard disc drive arranged therein. A constant temperature range (rated temperature) is defined to guarantee a satisfactory operation in such system and device, and a cooling fan dedicated to each device and a system shared fan shared by the entire system are generally arranged in the computer system to maintain the temperature inside the system and of each device to the rated temperature.

A method of controlling the operation of the cooling fan for cooling the computer system includes a method of setting a specific rotation number (weighting) on a plurality of cooling fans shared in the computer system and performing the control, and a method of acquiring temperature data from each operation unit of the computer system using a temperature sensor, and controlling the rotation number of the cooling fan according to the temperature data. When cooling a plurality of cooling targets by means of the plurality of cooling fans, a cooling fan control method of controlling the system shared fan and determining the rotation number in accordance with the cooling target having the highest cooling demand in the system is used.

A method of weighing in correspondence to the respective cooling ability of a plurality of cooling device for cooling the cooling target of the computer system, and controlling the cooling operation based on the weight (point) is disclosed (Japanese Laid-Open Patent Publication No. 11-40971 (patent document 1).

However, in the cooling fan control method described above, since the entire system is set as the cooling target, more than necessary cooling is performed on the cooling target that does not have a high cooling demand. The power consumption and noise thus becomes larger than necessary.

Similarly, when acquiring the temperature data from each operation unit of the computer system in operation using the temperature sensor, and determining the rotation number of the system shared fan in accordance with the portion having the highest cooling demand in the system, as described above, the power consumption and noise thus becomes larger than necessary.

SUMMARY OF THE INVENTION

It is an exemplary object of the present invention to provide a fan rotation control method, a fan rotation control system, and a fan rotation control program for appropriately cooling the cooling target according to the configuration of the operation unit and the operation state of the computer system in the enclosure and effectively suppressing power consumption and noise.

In order to achieve the above aim, a fan rotation control system according to an exemplary aspect of the invention includes a plurality of system cooling fans for cooling an operation unit of a computer system installed in an enclosure, and a fan rotation control unit for controlling the rotation of each system cooling fan, and the fan rotation control unit includes, a supply cooling amount storage device for storing in advance a supply cooling amount which is to be supplied to the operation unit by each system cooling fan, a necessary cooling amount calculating device for acquiring information related to a temperature of the operation unit and calculating a necessary cooling amount necessary in the operation unit based on the information, and a fan rotation number determining device for determining the rotation number of each system cooling fan based on the supply cooling amount and the necessary cooling amount.

A fan rotation control method according to another exemplary aspect of the invention is a method for controlling a rotation of each of a plurality of system cooling fans for cooling an operation unit of a computer system installed in an enclosure, the method including the steps of storing a supply cooling amount which is to be supplied to each operation unit by each system cooling fan calculated in advance, acquiring information related to a temperature of the operation unit and calculating a necessary cooling amount which is to be required in the operation unit based on the information; determining the rotation number of each system cooling fan based on the calculated necessary cooling amount and the supply cooling amount; and controlling the rotation of each system cooling fan based on the determined fan rotation number.

A fan rotation control program according to still another exemplary aspect of the invention is a program for controlling a rotation of a plurality of system cooling fans for cooling an operation unit of a computer system installed in an enclosures the program causing a computer to execute supply cooling amount storing function of storing a supply cooling amount which is to be supplied to the operation unit by each system cooling fan calculated in advance; necessary cooling amount calculating function of acquiring information related to a temperature of the operation unit and calculating a necessary cooling amount which is to be required in the operation unit based on the information; fan rotation number determining function of determining the rotation number of each system cooling fan based on the calculated necessary cooling amount and the supply cooling amount; and fan rotation controlling function of controlling the rotation of each system cooling fan based on the determined fan rotation number.

DETAILED DESCRIPTION OF THE EXEMPLARY EMBODIMENTS

First Exemplary Embodiment

A first exemplary embodiment of a fan rotation control system according to the present invention will now be described.

Figure 1:
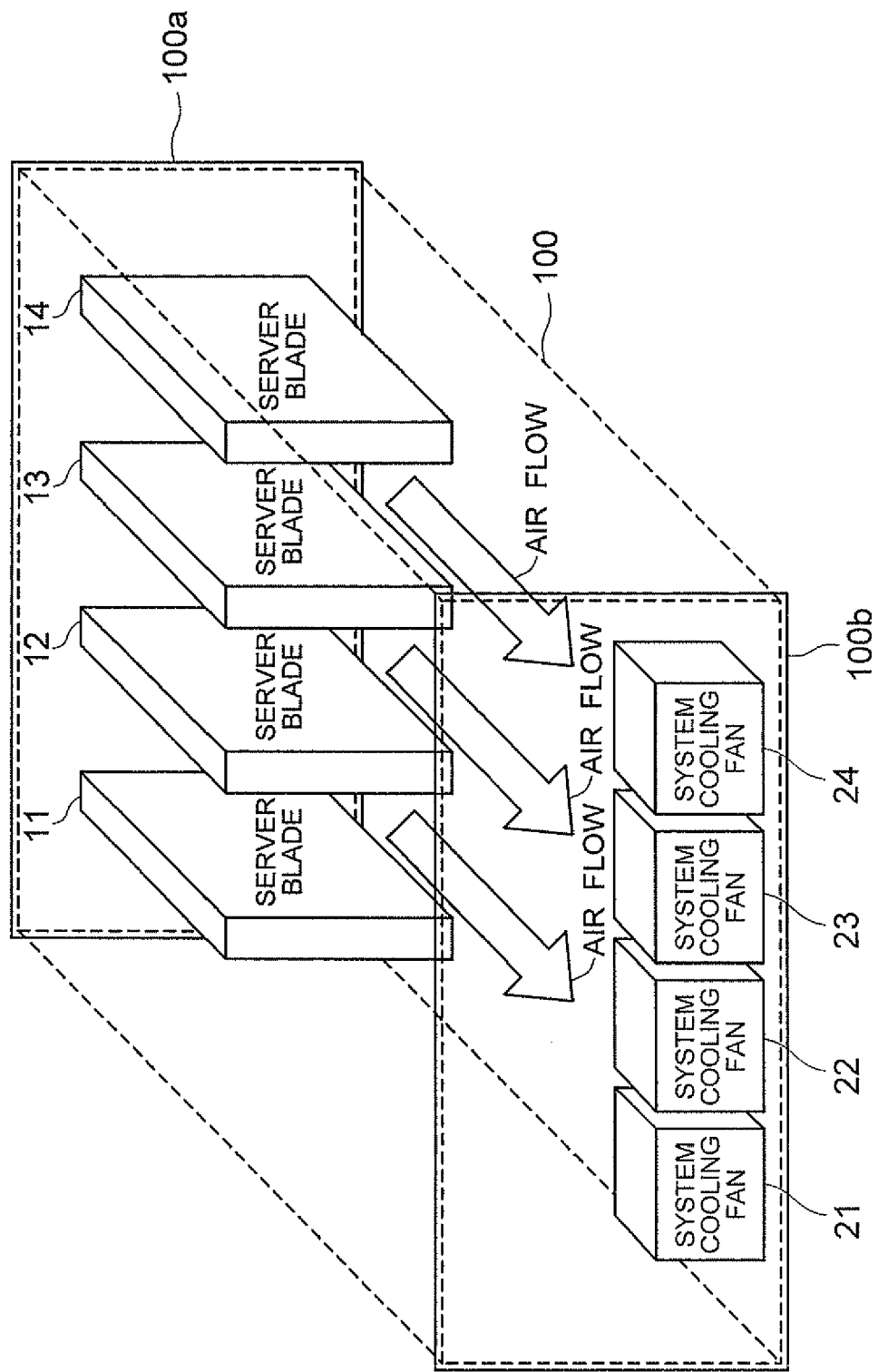
FIG. 1 is a schematic configuration view showing an entire fan rotation control system according to one exemplary embodiment of the invention.

As shown in FIG. 1, the first exemplary embodiment relates to a blade server enclosure 100 including a plurality of server blades, where server blades 11 to 14 respectively serving as a server are arranged on a front surface side 100a in the enclosure, and system cooling fans 21 to 24 for cooling the server blades 11 to 14 are arranged on a rear surface side 100b in the enclosure facing the respective server blade 11 to 14. The system cooling fans 21 to 24 are assumed as shared fans shared by the entire blade system in the blade server enclosure 100.

The server blades 11 to 14 respectively include at least a memory, a hard disc, and a microprocessor, and operate as independent servers.

The blade server enclosure 100 has a configuration of generating air flow from the front surface of the enclosure towards the rear surface of the enclosure by fan rotation of the system cooling fans 21 to 24, and radiating heat generated mainly by the operation of the server blades 11 to 14 in the enclosure from each system cooling fan.

Figure 2:
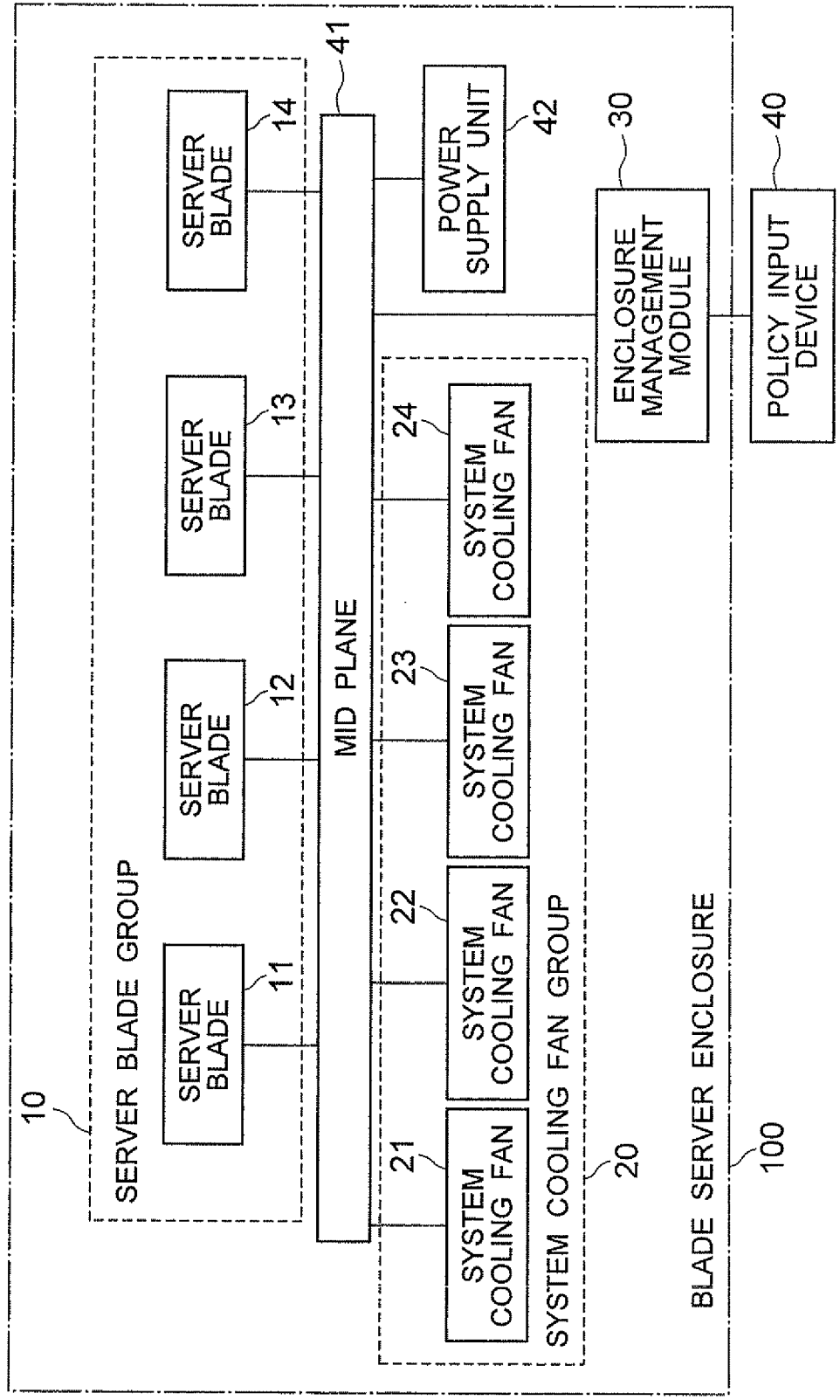
FIG. 2 is a schematic configuration view showing one configuration example of the fan rotation control system shown in FIG. 1.

As shown in FIG. 2, the blade server enclosure 100 has a server blade group 10 including the server blades 11 to 14, a system cooling fan group 20 including the system cooling fans 21 to 24, and an enclosure management module (fan rotation control unit) 30 for managing the temperature in the enclosure by controlling the system cooling fan group 20.

Each server blade 11 to 14, each system cooling fan 21 to 24, and the enclosure management module 30 are interconnected by way of a mid plane 41, where a power supply unit 42 for supplying power to each server blade 11 to 14, each system cooling fan 21 to 24, and the enclosure management module 30 is connected to the mid plane 41.

A policy input device (control policy input. device) 40 which performs input of a control policy for specifying the control content of one of power consumption reduction control, noise reduction control, or cooling efficiency priority control set in advance with respect to the enclosure management module 30 is arranged exterior to the blade server enclosure 100.

The policy input device 40 may includes a user interface such as a switch or a touch panel for the user to select and specify the control policy.

The types of priority control in the control policy set in the policy input device 40 is not limited to the above.

Figure 3:
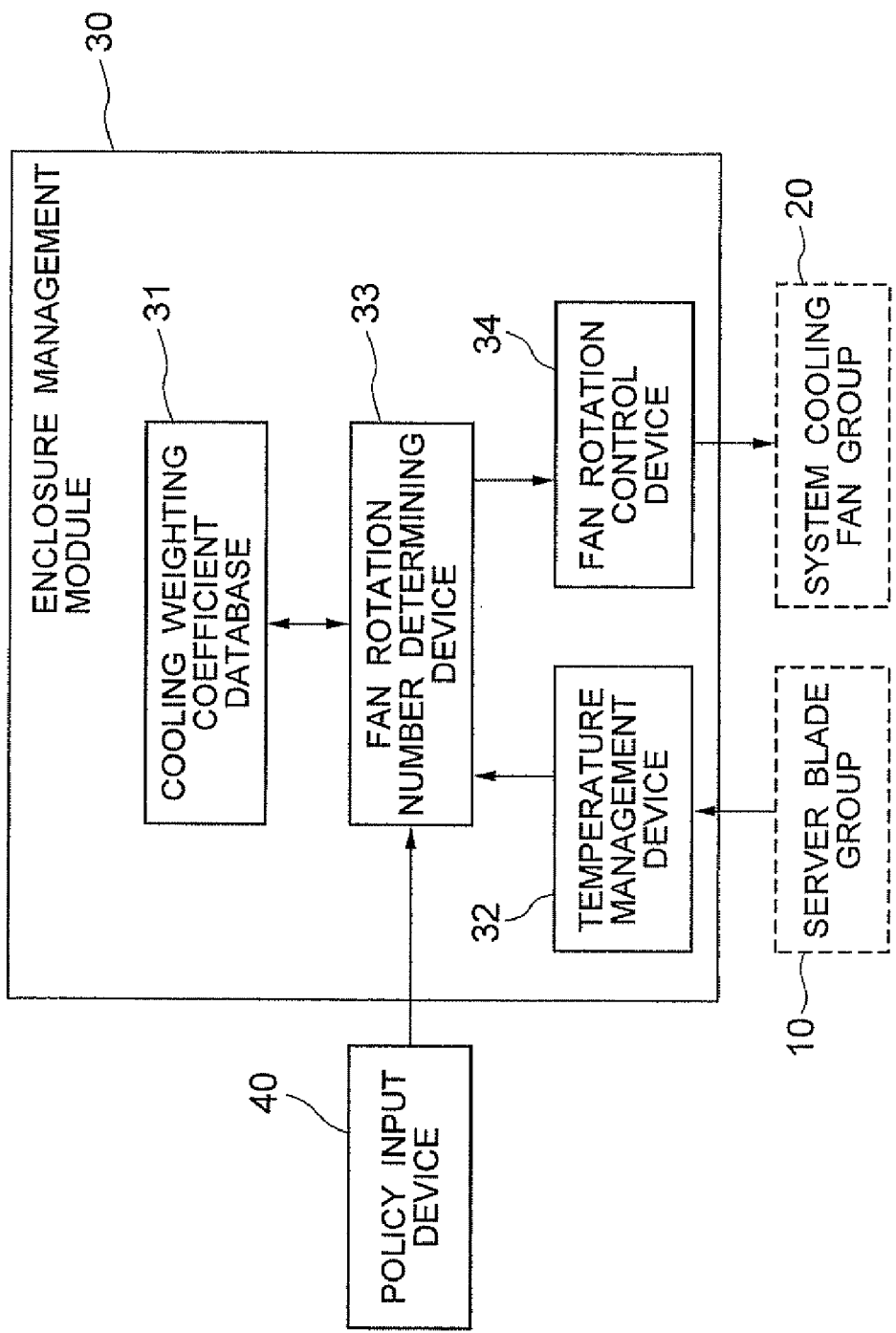
FIG. 3 is a block diagram showing one example of a configuration content of an enclosure management module in a first exemplary embodiment of the fan rotation control system of FIG. 2.

As shown in FIG. 3, the enclosure management module 30 includes a cooling weighting coefficient database (cooling amount storage device) 31 for storing in advance the cooling amount (hereinafter referred to as "supply cooling amount") supplied by each system cooling fan to each server blade 11 to 14, and a temperature management device 32 for acquiring information (hereinafter referred to as "temperature parameter") on the temperature of each server blade 11 to 14. A fan rotation number determining device 33 for determining the rotation number of each system cooling fan 21 to 24 based on the temperature parameter acquired in the temperature management device 32 and the cooling weighting coefficient stored in the cooling weighting coefficient database 31, and a fan rotation control device 34 for controlling each system cooling fan 21 to 24 based on the determined rotation number of the fan are also arranged.

This will be described in detail below.

The cooling weighting coefficient database 31 has a cooling weighting coefficient storing function for storing the cooling weighting coefficient assigned to each system cooling fan 21 to 24 based on the supply cooling amount which is to be supplied to each server blade 11 to 14 by each system cooling fan 21 to 24 measured in advance.

Regarding the cooling amount on the server blade 11 in FIG. 1, the supply cooling amount supplied from the system cooling fan 21, which is installed facing the server blade 11, is the largest, and the supply cooling amount on the server blade 11 becomes smaller as the physical position becomes farther away from the server blade 11 that is, in the order of the system cooling fan 22, the system cooling fan 23, and the system cooling fan 24.

In addition to the physical configuration position, there are a plurality of factors which influences the supply cooling amount of each system cooling fan 21 to 24 to be supplied to each server blade 11 to 14, but in the exemplary embodiment of the invention, the relationship on the supply cooling amount of each system cooling fan 21 to 24 and each server blade 11 to 14 is measured and calculated in advance according to the configuration of the computer system serving as the target. Such measurement and calculation may be measurement using the actual machine, or measurement using computer simulation.

If the supply cooling amount on the server blade 11 of each system cooling fan 21 to 24 (cooling ability, fan rotation speed, size, and the like of each system cooling fan 21 to 24 are assumed to be the same) has a ratio of 10, 6, 3, and 1, respectively, such ratio becomes the cooling weighting coefficient. Therefore, the supply cooling amount of the system cooling fans 21 to 24 on each server blade 11 to 14 is measured, and the cooling weighting coefficient is calculated based on the measured supply cooling amount and stored in the cooling weighting database 31.

The temperature management device 32 acquires the information (temperature parameter) on the temperature inside the blade server enclosure 100 related to the determination of the rotation number of each system cooling fan 21 to 24, and calculates the cooling amount (hereinafter referred to as "necessary cooling amount") which is required in each server blade 11 to 14 based on the acquired temperature parameter.

The acquired temperature parameter may include temperature of the operation unit (cooling target), air intake temperature, air exhaust temperature, air intake wind amount, and power consumption in each server blade 11 to 14, heat generated amount from the server blades 11 to 14, load status of the server, ON/OFF state of the power supply, environment temperature in the enclosure, or the like.

The fan rotation number determining device 33 acquires the weighting coefficient corresponding to each system cooling fan 21 to 24 by referencing the cooling weighting coefficient database 31, and acquires the necessary cooling amount of each server blade 11 to 14 calculated by the temperature management device 32.

The fan rotation number determining device 33 receives a cooling control policy sent from the policy input device 40, and determines the rotation number of each system cooling fan 21 to 24 based on the acquired cooling weighting coefficient, the acquired necessary cooling amount, and the received cooling control policy.

A case where the necessary cooling amount of the server blade 11 calculated by the temperature management device 32 is five will be described by way of example. Assume that the weighting coefficient of the system cooling fan 21 on the server blade 11 is ten, and the weighting coefficient of the system cooling fan 22 on the server blade 11 is six. The maximum value of the rotation rate with each system cooling fan is 0.5.

In this case, by rotating the system cooling fan 21, cooling weighting coefficient of which on the server blade 11 is ten, at the rotation rate of 0.5, the necessary cooling amount can be reached (10×0.5). When simultaneously rotating the system cooling fans 21 and 22, by rotating the system cooling fan 21 at the rotation rate of 0.4 and rotating the system cooling fan 22 at the rotation rate of 0.17, the necessary cooling amount can be reached (10×0.4+6×0.17).

Here, a case of having the product of the cooling weighting coefficient and the fan rotation rate as the value of the cooling amount (hereinafter referred to as "actual supply cooling amount") which is actually supplied to each server blade from each system cooling fan has been described, but a value calculated through other calculation methods using the cooling weighting coefficient and the value of the fan rotation rate may be used as the actual supply cooling amount supplied from each system cooling fan to each server blade.

A case where the fan rotation number determining device 33 determines the rotation number of the fan based on the cooling control policy sent from the policy input device 40 will now be described.

For instance, when the fan rotation number determining device 33 receives the control policy prioritizing low power consumption from the policy input device 40, the fan rotation number is determined such that the system cooling fan having large weighting is actively rotated, and the system cooling fan having small weighting is barely rotated. The power consumption is thereby suppressed and the cooling efficiency can be enhanced.

Furthermore, when receiving the control policy prioritizing low noise, the fan rotation number determining device 33 determines the fan rotation number so as to rotate the fans having small weighting parallely. The maximum rotation number in the entire system cooling fan group 20 is thereby suppressed, and noise can be reduced.

The fan rotation control device 34 has a fan rotating operation control function of receiving the fan rotation number determined by the fan rotation number determining device 33 and controlling the rotating operation of the system cooling fan based on the fan rotation number.

The control of the fan rotation number corresponding to the change in the operation state (temperature state) of the computer system in the enclosure is thereby performed.

Description on Operation of the First Exemplary Embodiment

The overall operation of the fan rotation control system in the first exemplary embodiment will now be described.

In the exemplary embodiment, the supply cooling amount from each system cooling fan 21 to 24 to each server blade 11 to 14 is calculated and stored (supply cooling amount calculating and storing process). The enclosure management module 30 then acquires the information related to the temperature of each server blade 11 to 14, and calculates the necessary cooling amount which is to be required in each server blade 11 to 14 based on the relevant information (necessary cooling amount calculating process).

The enclosure management module 30 acquires the control policy specifying one of the controls of power consumption reduction control, noise reduction control, or cooling efficiency priority control set in advance (control policy acquiring process), and determines the fan rotation number of each system cooling fan based on the acquired control policy, the calculated supply cooling amount, and the calculated necessary cooling amount (priority fan rotation number determining process). The rotation of each system cooling fan is controlled based on the determined fan rotation number (fan rotation controlling process).

The execution content of the supply cooling amount storing process (supply cooling amount storing function), the necessary cooling amount calculating process (necessary cooling amount calculating function), the control policy acquiring process (control policy acquiring function), the priority fan rotation number determining process (priority fan rotation number determining function), and the fan rotation controlling process (fan rotation controlling function) may be programmed to be executed by the computer.

Figure 4:
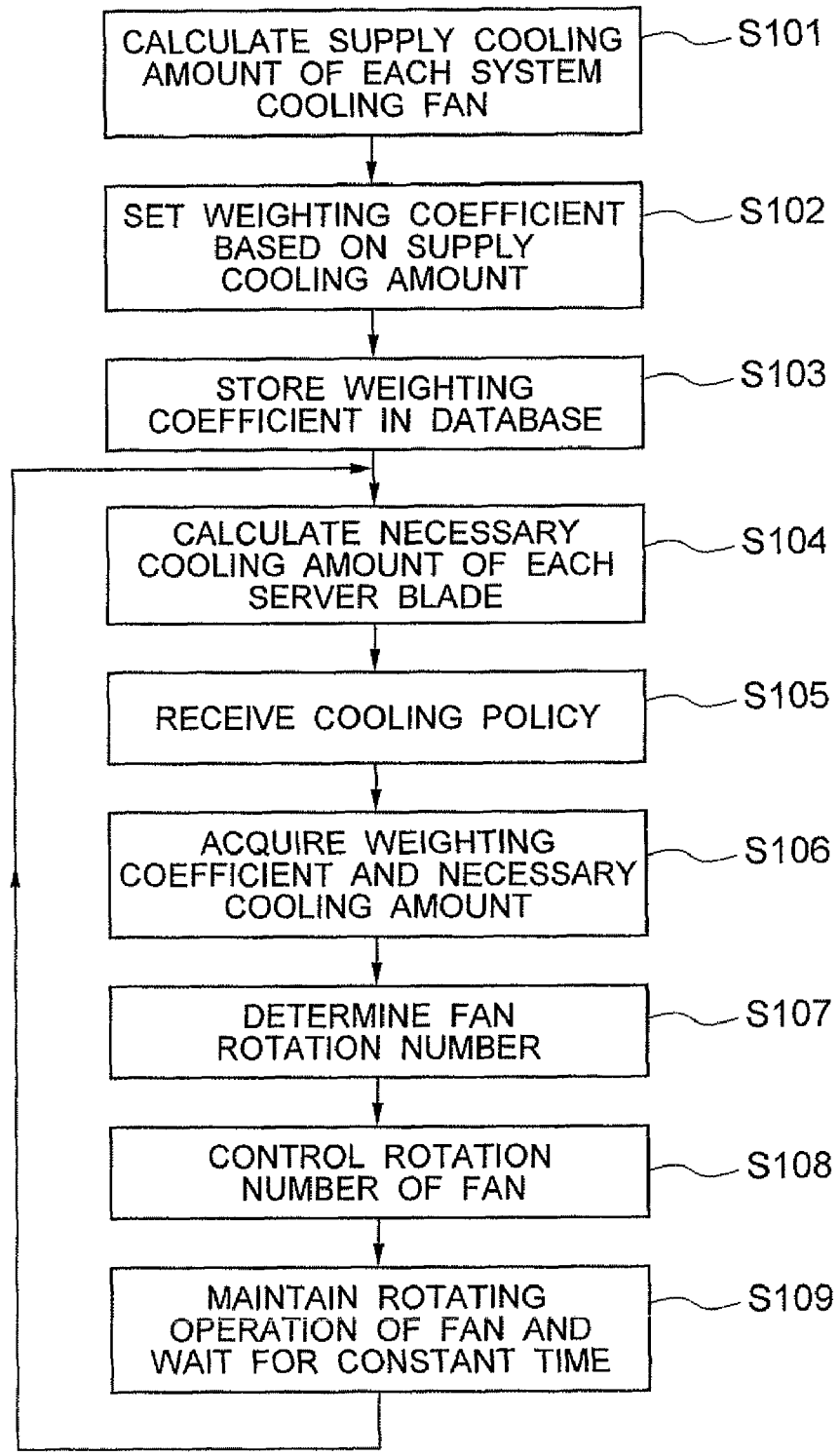
FIG. 4 is a flowchart schematically showing processing steps of a method for controlling the system cooling fan in the first exemplary embodiment of the fan rotation control system of FIG. 1.

The operation of the fan rotation control system in the first exemplary embodiment will be described based on the flowchart of FIG. 4.

First, each system cooling fan 21 to 24 calculates the supply cooling amount to be supplied to each server blade 11 to 14 (step S101). The cooling weighting coefficient is set to each system cooling fan 21 to 24 based on the calculated supply cooling amount (step S102), and the cooling weighting coefficient is stored in the weighting database 31 of the enclosure management module 30 (step S103: supply cooling amount storing process).

The temperature management device 32 acquires the temperature parameter of the enclosure, and calculates the necessary cooling amount of each server blade 11 to 14 (step S104: necessary cooling amount calculating process).

The fan rotation number determining device 33 receives the cooling control policy sent from the policy input device 40 (step S105: control policy acquiring process). The control policy acquiring process of step S105 may be carried out at any timing as long as it is before S107, to be hereinafter described.

The fan rotation number determining device 33 then acquires the cooling weighting coefficient of each system cooling fan 21 to 24 from the cooling weighting database 31 (step S106). The rotation number of each system cooling fan 21 to 24 is determined based on the cooling control policy, the necessary cooling amount, and the cooling weighting coefficient (step S107: priority fan rotation number determining process).

The fan rotation control device 34 then controls the rotation number of each system cooling fan 21 to 24 based on the determined rotation number (step S108: fan rotation controlling process).

The enclosure management module 30 controls the rotation of the cooling fan according to change in the operation state (detected temperature parameter) of the enclosure, and thus maintains the operation of the system cooling fan over a preset time (step S109).

Thereafter, the temperature parameter of each server 11 to 14 is again acquired in step S104, and the operations of steps S104 to S109 are repeated.

The rotation number of the system cooling fans 21 to 24 can then be controlled according to the heat generating state that changes with processing operation, load and the like of each server blade 11 to 14, or the cooling target of the blade system.

The rotation control of each system cooling fan can be performed based on the configuration of the computer system (server system) of the enclosure and the supply cooling amount which is to be supplied to the server blade by each system cooling fan in such configuration. Thus, the rotation control suited to the configuration of the enclosure can be performed, and power consumption as well as noise can be efficiently suppressed.

Furthermore, the present invention can be easily introduced to the cooling system of the existing computer system without newly installing a special hardware, and can be flexibly applied according to each system configuration.

Since each fan rotation number can be determined based on the cooling control policy specified by the user, the rotation of the system cooling fan can be controlled from the user side according to the operation state and the operation environment of the computer system. Thus, the operation mode can be specified such as a control mode of reducing power consumption as much as possible according to the period of time can be specified or a control mode of reducing noise as much as possible for a constant time can be specified.

Furthermore, the operation lifetime of each cooling fan becomes longer since the system cooling fan having low cooling efficiency does not need to be needlessly operated.

In the aforementioned exemplary embodiment, the operation unit of the computer system can be cooled according to the operation state, and power consumption and noise involved in the rotation of the system cooling fan can be effectively suppressed.

As an exemplary advantage according to the invention, the present invention has a configuration of arranging a fan rotation control unit for controlling the rotation of a plurality of system cooling fans for cooling the operation unit of the computer system in the enclosure, the fan rotation control unit having a function of storing the supply cooling amount to be supplied to the operation unit in advance, and a function of acquiring information related to the temperature of the operation unit; whereby the operation unit of the computer system can be cooled according to the operation state, and power consumption and noise involved in the rotation of the system cooling fan can be effectively suppressed.

Second Exemplary Embodiment

The second exemplary embodiment of the fan rotation control system according to the present invention will now be described. The same reference numerals are denoted for the same portions as in the first exemplary embodiment described above.

The equipment configuring portion of the system of the second exemplary embodiment has substantially the same configuration as that of the first exemplary embodiment (FIG. 3) described above, and differs from the first exemplary embodiment in that a fan rotation number monitoring device 51 for notifying the rotation number of the system cooling fan in operation to the fan rotation number determining device 33 is arranged in the enclosure management module 30.

This will be specifically described below.

Similar to the first exemplary embodiment, the second exemplary embodiment relates to a blade server enclosure 100 including a plurality of server blades, as shown in FIG. 1, where the server blades 11 to 14 respectively operating as a server is arranged on the front surface side of the enclosure and the system cooling fans 21 to 24 for cooling the server blades 11 to 14 are arranged facing the corresponding server blade 11 to 14 in the rear surface side of the enclosure. The system cooling fans 21 to 24 are assumed to be a system shared fan which is shared by the entire blade system in the blade server enclosure 100.

The blade server enclosure 100 has a configuration of generating air flow from the front surface of the enclosure towards the rear surface of the enclosure by fan rotation of the system cooling fans 21 to 24, and radiating heat inside the enclosure from each system cooling fan.

The server blades 11 to 14 are respectively assumed as a server blade including at least a memory, a hard disc, and a microprocessor, and independently operating as a server.

As shown in FIG. 2, the blade server enclosure 100 has the server blade group 10 including the server blades 11 to 14, the system cooling fan group 20 including the system cooling fans 21 to 24, and the enclosure management module (fan rotation control unit) 30 for managing the temperature in the enclosure by controlling the system cooling fan group 20.

Each server blade 11 to 14, each system cooling fan 21 to 24, and the enclosure management module 30 are interconnected by way of a mid plane 41, where the power supply unit 42 for supplying power to each server blade 11 to 14, each system cooling fan 21 to 24, and the enclosure management module 30 is connected to the mid plane 41.

Furthermore, the policy input device (control policy input device) 40 which is connected to the enclosure management module 30 and which performs input of a control policy for specifying the control content of one of power consumption reduction control, noise reduction control, or cooling efficiency priority control set in advance with respect to the enclosure management module 30 is arranged exterior to the blade server enclosure 100.

The policy input device 40 may includes a user interface such as a switch or a touch panel for the user to select and specify the control policy.

The types of priority control in the control policy set in the policy input device 40 is not limited to the above.

Figure 5:
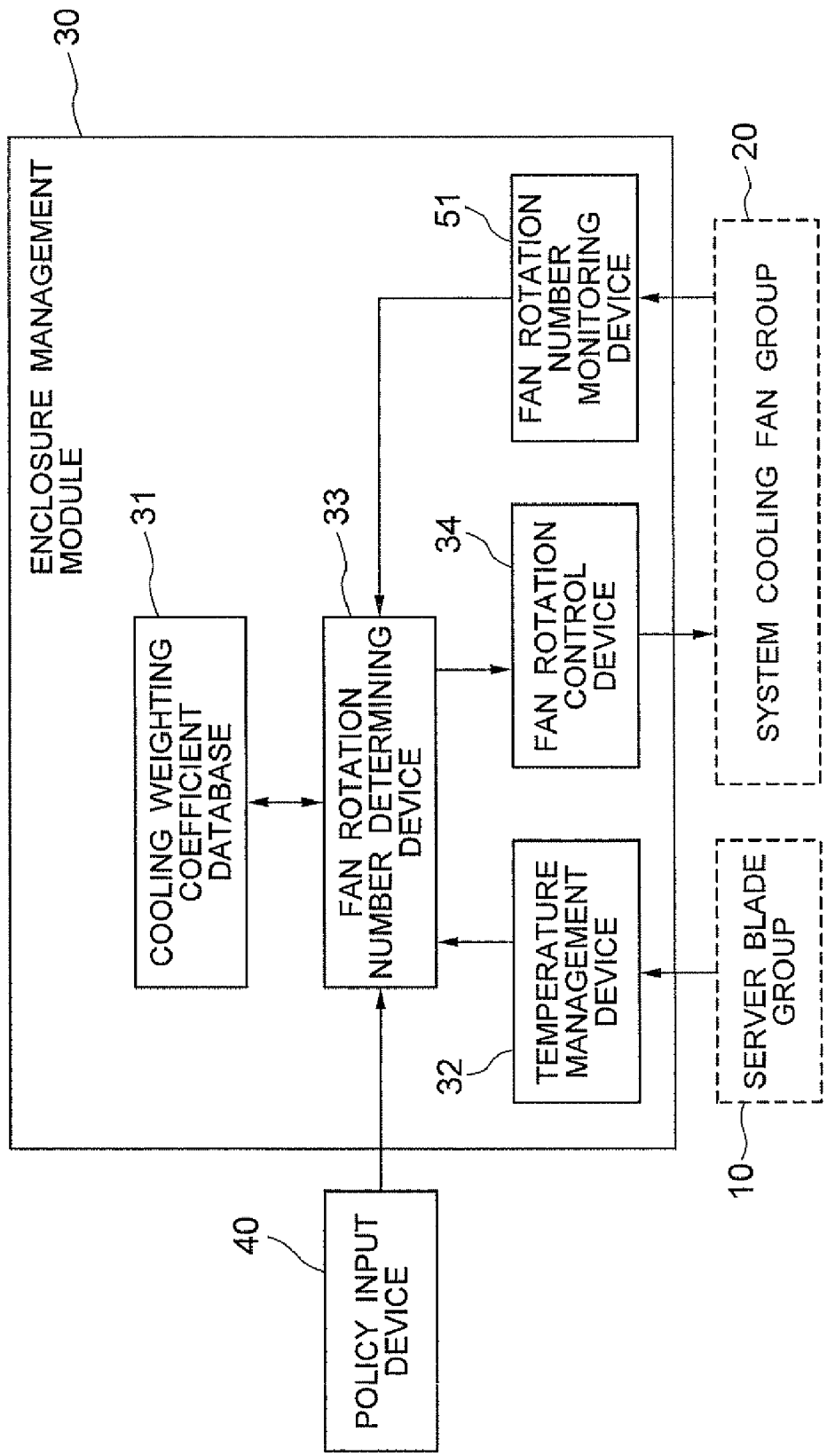
FIG. 5 is a block diagram showing one example of a configuration content of an enclosure management module in a second exemplary embodiment of the fan rotation control system of FIG. 2.

As shown in FIG. 5, the enclosure management module 30 includes the cooling weighting coefficient database (cooling amount storage device) 31 for storing in advance the cooling amount (hereinafter referred to as "supply cooling amount") supplied by each system cooling fan to each server blade 11 to 14, and a temperature management device 32 for acquiring temperature parameter of each server blade 11 to 14. The fan rotation number determining device 33 for determining the rotation number of each system cooling fan 21 to 24 based on the temperature parameter acquired in the temperature management device 32 and the cooling weighting coefficient stored in the cooling weighting coefficient database 31 is also arranged. Moreover, the fan rotation control device 34 for controlling each system cooling fan 21 to 24 based on the determined rotation number and the fan rotation number monitoring device 51 for detecting the rotation number of the system cooling fans 21 to 24 in the operation state are arranged.

This will be specifically described below.

The cooling weighting coefficient database 31 has a cooling weighting coefficient storing function for storing the cooling weighting coefficient assigned to each system cooling fan 21 to 24 based on the supply cooling amount supplied to each server blade 11 to 14 by each system cooling fan 21 to 24 measured in advance.

Regarding the cooling amount on the server blade 11 in FIG. 1, the supply cooling amount supplied from the system cooling fan 21, which is installed facing the server blade 11, is the largest, and the supply cooling amount on the server blade 11 becomes smaller as the physical position becomes farther away from the server blade 11, that is, in the order of the system cooling fan 22, the system cooling fan 23, and the system cooling fan 24.

In addition to the physical configuration position, there are a plurality of factors which influences the supply cooling amount of each system cooling fan 21 to 24 to be supplied to each server blade 11 to 14, but in the exemplary embodiment of the invention, the relationship on the supply cooling amount of each system cooling fan 21 to 24 and each server blade 11 to 14 is measured and calculated in advance according to the configuration of the computer system serving as the target. Such measurement and calculation may be measurement using the actual machine, or measurement using computer simulation.

If the supply cooling amount on the server blade 11 of each system cooling fan 21 to 24 (cooling ability, fan rotation speed, size, and the like of each system cooling fan 21 to 24 are assumed to be the same) has a ratio of 10, 6, 3, and 1, respectively, such ratio becomes the cooling weighting coefficient. Therefore, the supply cooling amount of the system cooling fans 21 to 24 on each server blade 11 to 14 is measured, and the cooling weighting coefficient is calculated based on the measured supply cooling amount and stored in the cooling weighting database 31.

The temperature management device 32 acquires the information (temperature parameter) on the temperature inside the blade server enclosure 100 related to the determination of the rotation number of each system cooling fan 21 to 24, and calculates the cooling amount (hereinafter referred to as "necessary cooling amount") which is required in each server blade 11 to 14 based on the acquired temperature parameter.

The acquired temperature parameter includes temperature of the operation unit (cooling target), air intake temperature, air exhaust temperature, air intake wind amount, and power consumption in each server blade 11 to 14, heat generated amount from the server blades 11 to 14, load status of the server, ON/OFF state of the power supply, environment temperature in the enclosure, or the like.

The fan rotation number determining device 33 acquires the weighting coefficient corresponding to each system cooling fan 21 to 24 by referencing the cooling weighting coefficient database 31, and acquires the necessary cooling amount of each server blade 11 to 14 calculated by the temperature management device 32.

The fan rotation number determining device 33 receives a cooling control policy sent from the policy input device 40, and determines the rotation number of each system cooling fan 21 to 24 based on the acquired cooling weighting coefficient, the acquired necessary cooling amount, and the received cooling control policy.

A case where the necessary cooling amount of the server blade 11 calculated by the temperature management device 32 is five will be described by way of example. Assume that the weighting coefficient of the system cooling fan 21 on the server blade 11 is ten, and the weighting coefficient of the system cooling fan 22 on the server blade 11 is six. Here, the maximum value of a rotation rate with each system cooling fan is 0.5.

In this case, by rotating the system cooling fan 21, cooling weighting coefficient of which on the server blade 11 is ten, at the rotation rate of 0.5, the necessary cooling amount can be reached (10×0.5). When simultaneously rotating the system cooling fans 21 and 22, by rotating the system cooling fan 21 at the rotation rate of 0.4 and rotating the system cooling fan 22 at the rotation rate of 0.17, the necessary cooling amount can be reached (10×0.4+6×0.17).

Here, a case of having the product of the cooling weighting coefficient and the fan rotation rate as the value of the cooling amount (hereinafter referred to as "actual supply cooling amount") which is actually supplied to each server blade from each system cooling fan has been described, but a value calculated through other calculation methods using the cooling weighting coefficient and the value of the fan rotation rate may be used as the actual supply cooling amount supplied from each system cooling fan to each server blade.

A case where the fan rotation number determining device 33 determines the rotation number of the fan based on the cooling control policy sent from the policy input device 40 will now be described.

For instance, when the fan rotation number determining device 33 receives the control policy prioritizing low power consumption from the policy input device 40, the fan rotation number is determined such that the system cooling fan having large weighting is actively rotated, and the system cooling fan having small weighting is barely rotated. The power consumption is thereby suppressed and the cooling efficiency can be enhanced.

Furthermore, when receiving the control policy prioritizing low noise, the fan rotation number determining device 33 determines the fan rotation number so as to rotate the fans having small weighting parallely. The maximum rotation number in the entire system cooling fan group 20 is thereby suppressed, and noise can be reduced.

The fan rotation number determining device 33 has a weighting coefficient updating function of acquiring the fan rotation number notified from the fan rotation number monitoring device 51, to be hereinafter described, and updating the weighting coefficient stored in advance in the cooling weighting coefficient database 31 based on the fan rotation number. The fan rotation number determining device 33 may also have a weighting coefficient updating and setting function of updating and setting the weighting coefficient based on the acquired fan rotation number and the temperature parameter newly acquired by the temperature management device 32.

The fan rotation number determining device 33 further has a fan rotation number updating and determining function of updating and determining the fan rotation number based on the correlation information of the acquired fan rotation number and the temperature parameter of the blade server enclosure 100 acquired by the temperature management device 32.

The fan rotation number of the system cooling fan group 20 is thereby determined and controlled at a value closer to the actual operation state. Thus, power consumption and noise related to the rotation of the system cooling fan can be reduced.

The fan rotation control device 34 has a fan rotating operation control function of receiving the fan rotation number determined by the fan rotation number determining device 33 and controlling the rotating operation of the system cooling fan based on the fan rotation number.

The control of the fan rotation number corresponding to the change in the operation state (temperature state) of the computer system in the enclosure is thereby performed.

The fan rotation number monitoring device 51 has a fan rotation number detecting function of detecting the rotation number of each system cooling fan 21 to 24 in operation, and a fan rotation number notifying function of notifying the detected rotation number of each system cooling fan 21 to 24 to the fan rotation number determining device 33.

Description on Operation of the Second Exemplary Embodiment

The overall operation of the fan rotation control system in the second exemplary embodiment will now be described.

In the exemplary embodiment, the supply cooling amount from each system cooling fan 21 to 24 to each server blade 11 to 14 calculated in advance is stored (supply cooling amount storing process). The enclosure management module 30 then acquires the information related to the temperature of each server blade 11 to 14, and calculates the necessary cooling amount which is to be required in each server blade 11 to 14 based on the relevant information (necessary cooling amount calculating process).

The enclosure management module 30 acquires the control policy specifying one of the controls of power consumption reduction control, noise reduction control, or cooling efficiency priority control set in advance (control policy acquiring process), and determines the fan rotation number of each system cooling fan based on the acquired control policy, the calculated supply cooling amount, and the calculated necessary cooling amount (priority fan rotation number determining process).

Next, the rotation of each system cooling fan is controlled based on the determined fan rotation number (fan rotation controlling process). Then, the temperature parameter serving as information related to the temperature of the operation unit of the computer system is detected (temperature parameter acquiring process), the rotation number of each system cooling fan in operation is detected (fan rotation number monitoring process), and the supply cooling amount is updated and set based on the detected rotation number and the temperature parameter (supply cooling amount updating and setting process).

The execution content of the supply cooling amount storing process (supply cooling amount storing function), the necessary cooling amount calculating process (necessary cooling amount calculating function), the control policy acquiring process (control policy acquiring function), the priority fan rotation number determining process (priority fan rotation number determining function), the fan rotation controlling process (fan rotation controlling function), the temperature parameter acquiring process (temperature parameter acquiring function), the fan rotation number monitoring process (fan rotation number monitoring process), and the supply cooling amount updating and setting process (supply cooling amount updating and setting function) may be programmed to be executed by the computer.

Figure 6:
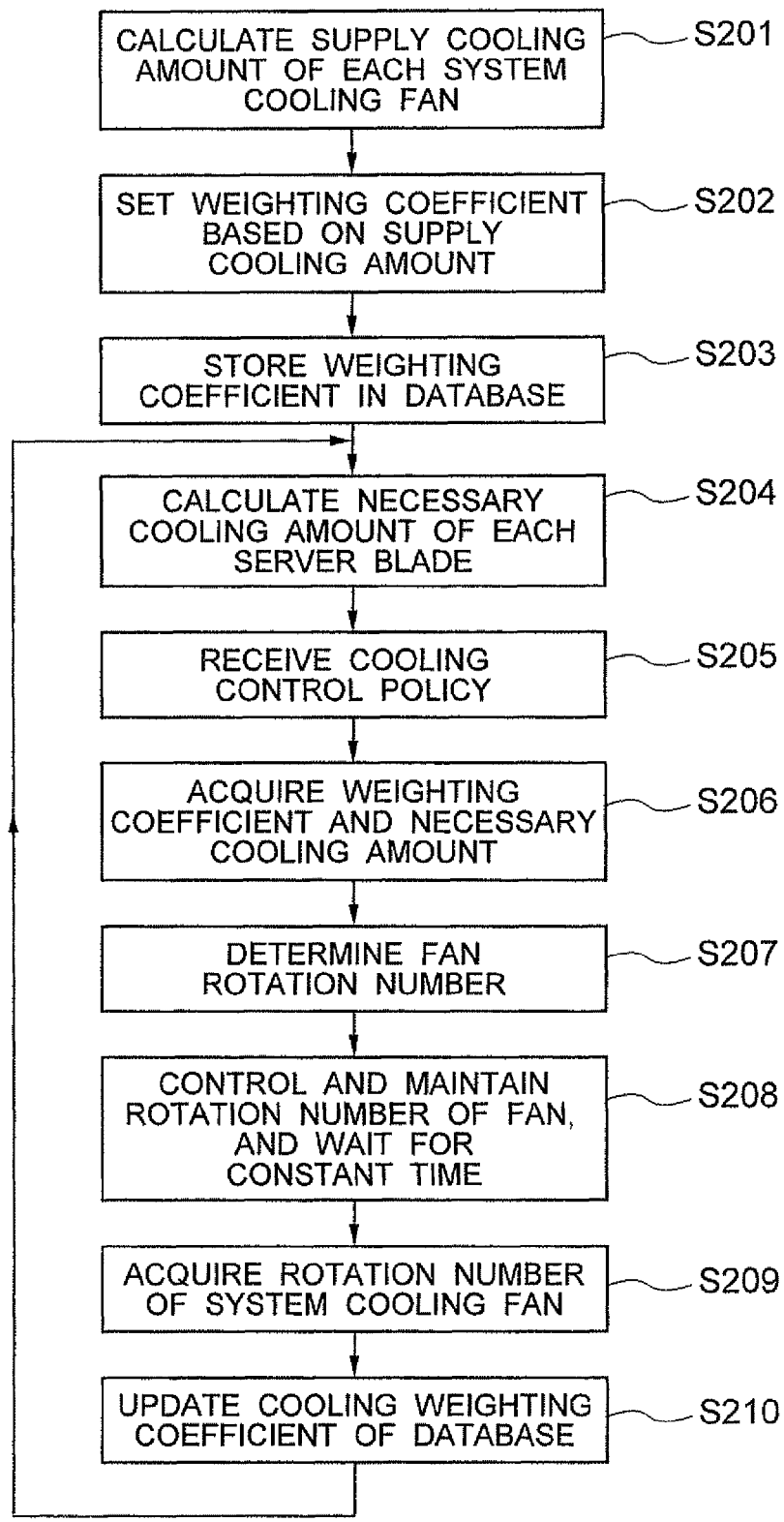
FIG. 6 is a flowchart schematically showing processing steps of a method for controlling the system cooling fan in the second exemplary embodiment of the fan rotation control system of FIG. 1.

The operation of the fan rotation control system in the second exemplary embodiment will be described based on the flowchart of FIG. 6.

First, each system cooling fan 21 to 24 calculates the supply cooling amount to be supplied to each server blade 11 to 14 (step S201). The cooling weighting coefficient is set to each system cooling fan 21 to 24 based on the calculated supply cooling amount (step S202), and the cooling weighting coefficient is stored in the weighting database 31 of the enclosure management module 30 (step S203: supply cooling amount storing process).

The temperature management device 32 acquires the temperature parameter of the enclosure, and calculates the necessary cooling amount of each server blade 11 to 14 (step S204: necessary cooling amount calculating process).

The fan rotation number determining device 33 receives the cooling control policy sent from the policy input device 40 (step S205: control policy acquiring process). The control policy acquiring process of step S205 may be carried out at any timing as long as it is before S207, to be hereinafter described.

The fan rotation number determining device 33 then acquires the cooling weighting coefficient of each system cooling fan 21 to 24 from the cooling weighting database 31 (step S206). The rotation number of each system cooling fan 21 to 24 is determined based on the cooling control policy, the necessary cooling amount, and the cooling weighting coefficient (step S207: priority fan rotation number determining process).

The fan rotation control device 34 then controls the rotation number of each system cooling fan 21 to 24 based on the determined rotation number. The operation of the system cooling fan is maintained over a preset constant time and the temperature management device 32 detects the temperature parameter (step S208: fan rotation controlling process).

The temperature management device 32 detects the temperature parameter of the operation unit of the computer system, and the fan rotation number monitoring device 51 detects the fan rotation number of each system cooling fan 21 to 24 in operation (step S209: fan rotation number detecting function). The weighting coefficient stored in the cooling weighting coefficient database 31 is updated and set based on the detected fan rotation number and the temperature parameter (step S210: supply cooling amount updating and setting process).

Thereafter, the temperature parameter of each server blade 11 to 14 is again acquired in step S204, and the operations of steps S204 to S210 are repeated.

According to the second exemplary embodiment, the rotation number of the system cooling fans 21 to 24 can be controlled according to the heat generating state that changes with processing operation, load and the like of each server blade 11 to 14, which is the cooling target of the blade system, similar to the fan rotation control system of the first exemplary embodiment.

Also, the rotation control of each system cooling fan can be performed based on the configuration of the computer system (server system) of the enclosure and the supply cooling amount to be supplied to the server blade by each system cooling fan in such configuration. Thus, the rotation control suited to the configuration of the enclosure can be performed, and power consumption as well as noise can be efficiently suppressed.

Furthermore, the present invention can be easily introduced to the cooling system of the existing computer system without newly installing a special hardware, and can be flexibly applied according to each system configuration.

Since each fan rotation number can be determined based on the cooling control policy specified by the user, the rotation of the system cooling fan can be controlled from the user side according to the operation state and the operation environment of the computer system. Thus, the operation mode can be specified such as a control mode of reducing power consumption as much as possible according to the period of time can be specified or a control mode of reducing noise as much as possible for a constant time can be specified.

Furthermore, the operation lifetime of each cooling fan becomes longer since the system cooling fan having low cooling efficiency does not need to be needlessly operated.

In the second exemplary embodiment, effects similar to the first exemplary embodiment are obtained due to the configuration and the function described above, and furthermore, the weighting coefficient can be updated and set by applying feedback as needed on the change in the operation state (temperature state) of the computer system in the enclosure and the operation state of the system cooling fan with respect to the weighting coefficient database. The control of the fan rotation number corresponding to the actual fan operation state and the temperature environment in the enclosure is thereby performed.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

INDUSTRIAL APPLICABILITY

The present invention is applicable on the operation control of the system shared fan in the system including a plurality of operation units (cooling targets).

What is claimed is:

1. A fan rotation control system comprising a plurality of system cooling fans for cooling a plurality of different operation units installed next to each other as a computer system in an enclosure, and a fan rotation control unit for controlling the rotation of each system cooling fan, wherein the fan rotation control unit includes,
a supply cooling amount storage device for calculating and storing in advance a supply cooling amount which is to be supplied to each operation unit by each system cooling fan installed facing each operation unit,
a necessary cooling amount calculating device for calculating a necessary cooling amount which is to be required in each operation unit based on the information related to a cooling weighting coefficient calculated from a mutual physical positional relation of the operation units, the supply cooling amount and the temperature of the operation unit, and
a fan rotation number determining device for determining the rotation number of each system cooling fan that satisfies the necessary cooling amount calculated for each operation unit based on the supply cooling amount.

2. The fan rotation control system according to claim 1, wherein a fan rotation number monitoring device for detecting the rotation number of the system cooling fan in operation is arranged in the fan rotation control unit; and the fan rotation number determining device has a supply cooling amount updating function of updating and setting the stored supply cooling amount based on the detected rotation number of the system cooling fan.

3. The fan rotation control system according to claim 1, wherein a fan rotation number monitoring device for detecting the rotation number of the system cooling fan in operation is arranged in the fan rotation control unit; and the fan rotation number determining device updates and sets the stored supply cooling amount based on the detected rotation number of the system cooling fan and the information related to the temperature of the operation unit acquired in advance.

4. The fan rotation control system according to claim 1, wherein the supply cooling amount storage device sets a weighting coefficient to each system cooling fan based on the supply cooling amount, stores the weighting coefficient and is arranged in the fan rotation control unit.

5. A fan rotation control system comprising a plurality of system cooling fans for cooling a plurality of different operation units installed next to each other as a computer system in an enclosure, and a fan rotation control unit for controlling the rotation of each system cooling fan, wherein the fan rotation control unit includes,
a supply cooling amount storage means for calculating and storing in advance a supply cooling amount which is to be supplied to each operation unit by each system cooling fan installed facing each operation unit,
a necessary cooling amount calculating means for calculating a necessary cooling amount which is to be required in each operation unit based on a cooling weighting coefficient calculated from a mutual physical positional relation of the operation units, and
a fan rotation number determining means for determining the rotation number of each system cooling fan based on the supply cooling amount and the necessary cooling amount for each operation unit.

6. The fan rotation control system according to claim 1, wherein a control policy input device for sending a control policy for specifying a control content of one of power consumption reduction control, noise reduction control, or cooling efficiency priority control set in advance to the fan rotation control unit is annexed to the fan rotation control unit.

7. A fan rotation control method for controlling a rotation of each of a plurality of system cooling fans for cooling a plurality of different operation units installed next to each other as a computer system in an enclosure, the method comprising:
storing a supply cooling amount which is to be supplied to each operation unit by each system cooling fan installed facing each operation unit calculated in advance,
calculating a necessary cooling amount which is to be required in each operation unit based on information related to a cooling weighting coefficient calculated from a mutual physical positional relation of the operation units, the supply cooling amount and the temperature of the operation unit;
determining the fan rotation number of each system cooling fan that satisfies the necessary cooling amount calculated for each operation unit based on the supply cooling amount; and
controlling the rotation of each system cooling fan based on the determined fan rotation number.

8. The fan rotation control method according to claim 7, further comprising: determining the rotation number of each system cooling fan based on the acquired control policy, the supply cooling amount, and the necessary cooling amount.

9. The fan rotation control method according to claim 7, further comprising:
detecting the rotation number of the system cooling fan in operation, and updating and setting the supply cooling amount based on the detected rotation number.

10. The fan rotation control method according to claim 7, further comprising:
detecting a temperature parameter serving as information related to the temperature of the operation unit of the computer system, detecting the rotation number of the system cooling fan in operation, and updating and setting the stored supply cooling amount based on the detected rotation number and the temperature parameter.

11. A fan rotation control program for controlling a rotation of a plurality of system cooling fans for cooling a plurality of different operation units installed next to each other as a computer system in an enclosure, the program causing a computer to execute;
supply cooling amount storing function of calculating and storing a supply cooling amount which is to be supplied to each operation unit by each system cooling fan installed facing each operation unit, calculated in advance;

necessary cooling amount calculating function of calculating a necessary cooling amount which is to be required in each operation unit based on information related to a cooling weighting coefficient calculated from a mutual physical positional relation of the operating units;

fan rotation number determining function of determining the fan rotation number of each system cooling fan based on the necessary cooling amount calculated for each operation unit and the supply cooling amount; and fan rotation controlling function of controlling the rotation of each system cooling fan based on the determined fan rotation number.

12. The fan rotation control program according to claim 11, further causing the computer to execute control policy acquiring function of acquiring a control policy for specifying a control content of one of power consumption reduction control, noise reduction control, or cooling efficiency priority control set in advance, and priority fan rotation number determining function of determining the rotation number of each system cooling fan based on the acquired control policy, the supply cooling amount, and the necessary cooling amount.

13. The fan rotation control program according to claim 11, further causing the computer to execute a weighting coefficient storing function of setting a weighting coefficient to each cooling fan based on the supply cooling amount of each system cooling fan calculated in advance, and storing the weighting coefficient.

14. The fan rotation control program according to claim 11, further causing the computer to execute: fan rotation number monitoring function of detecting the fan rotation number in each system cooling fan in operation; and supply cooling amount updating function of updating and setting the stored supply cooling amount based on the detected fan rotation number.

15. The fan rotation control program according to claim 11, further causing the computer to execute: temperature parameter acquiring function of detecting a temperature parameter serving as information related to a temperature of the operation unit of the computer system; fan rotation number monitoring function of detecting the fan rotation number in each system cooling fan in operation; and supply cooling amount updating and setting function of updating and setting the stored supply cooling amount based on the detected fan rotation number and the temperature parameter.

* * * * *